Figure 1:
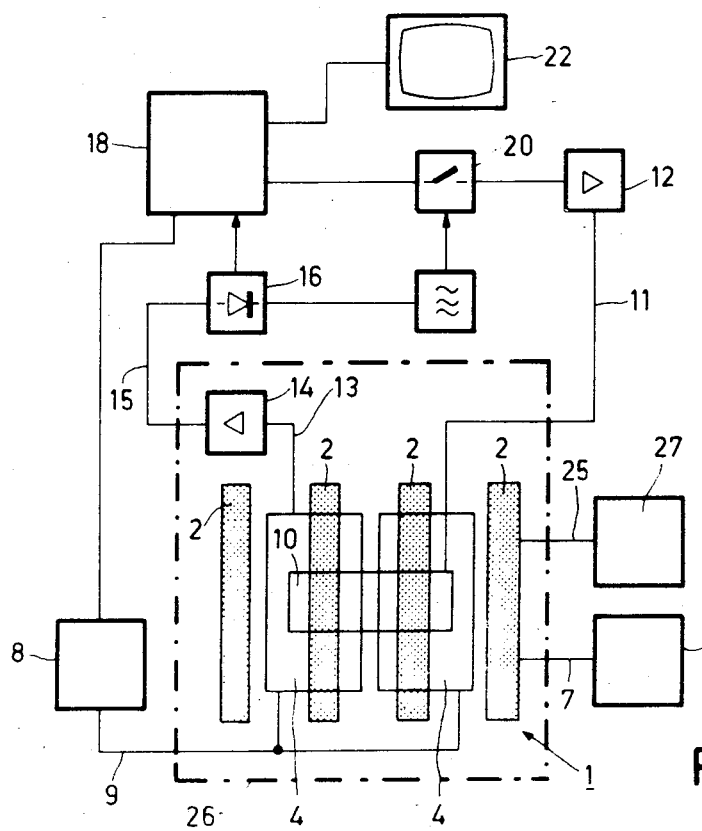

United States Patent [19]
Van Dijk

[11] Patent Number: 4,564,812
[45] Date of Patent: Jan. 14, 1986

[54] NUCLEAR MAGNETIC RESONANCE TOMOGRAPHY APPARATUS INCLUDING A FARADAY CAGE

[75] Inventor: Pieter Van Dijk, Eindhoven, Netherlands

[73] Assignee: U.S. Philips Corporation, New York, N.Y.

[21] Appl. No.: 530,807

[22] Filed: Sep. 9, 1983

[30] Foreign Application Priority Data
Sep. 20, 1982 [NL] Netherlands .......................... 8203621

[51] Int. Cl.⁴ ............................................ G01R 33/08
[52] U.S. Cl. .................................... 324/309; 324/72.5; 324/318
[58] Field of Search ............... 324/300, 307, 311, 316, 324/318, 319, 320, 322, 72.5, 457, 458, 158 P, 459

[56] References Cited
U.S. PATENT DOCUMENTS
4,280,096  7/1981  Karthe .................................. 324/309
4,354,499 10/1982  Damadian ........................... 324/309
4,435,681  3/1984  Masuda .............................. 324/459

Primary Examiner—Michael J. Tokar
Attorney, Agent, or Firm—Paul R. Miller

[57] ABSTRACT

A nuclear magnetic resonance tomography apparatus includes a Faraday cage which shields the measurement space against stray electromagnetic fields, and increases the Q factor of a coil circuit comprising the transmitting/receiving coils of the apparatus. This Faraday cage is arranged around the object space inside the magnetic coils for generating the necessary steady magnetic field, but around and outside the RF transmitting/receiving coil. The transmitting/receiving coil may be provided with comb-like screens which shield against electrical fields, and the Faraday cage may include a readily accessible extension having larger transverse dimensions.

16 Claims, 4 Drawing Figures

NUCLEAR MAGNETIC RESONANCE TOMOGRAPHY APPARATUS INCLUDING A FARADAY CAGE

The invention relates to a nuclear magnetic resonance tomography apparatus comprising, arranged around an examination space for an object to be examined, a first coil arrangement for generating a steady main magnetic field and a quasi-steady gradient field, a second coil arrangement for generating an RF magnetic field, a measurement device for detecting nuclear magnetic resonance signals generated by an object under examination, and a Faraday cage for shielding the examination space against stray electromagnetic fields.

A nuclear magnetic resonance tomography apparatus of this kind is known from Computertomographie I (1981) pages 2-10. In order to shield the examination space thereof against stray fields, a Faraday cage is arranged around the assembly of coil arrangements (page 7). In order to prevent electrical conductors which penetrate the Faraday cage from acting as aerials, so that stray fields could still occur in the examination space, anti-interference filters are included in the conductors. The number of conductors penetrating such a cage may be substantial and includes all power supply leads for the various magnets, signal output leads and also ducts for a water cooling circuit or ducts for the supply of liquid helium when use is made of superconducting magnet coils. Interference suppression can be applied to all these conductors, but this would represent a comparatively expensive operation in view of the large number of conductors and the construction of some of the conductors which is adapted to specific functions. Moreover, a shield which does not function properly may readily remain unnoticed and may introduce an error in the measured signals, notably when one of the large conductors is concerned. The inventor has recognized the fact that, when viewed as inductance coils, the customery magnetic coil arrangements are comparatively inefficient, notably those relevant to the RF field. In order to obtain a useful measurement signal, therefore, a comparatively high RF transmission power is required in such an apparatus. The transmission coils for the customarily RF pulsed magnetic field are normally also used in such apparatus as detection coils for the nuclear magnetic resonance signals stimulated by the field. Consequently, a dual benefit would be derived from an increase in the efficiency of this coil arrangement. In order to improve a coil arrangement in this respect, the Q factor of the coil circuit must be increased. When the Q factor is increased, a lower RF transmission power suffices, due to the improved signal-to-noise ratio, and possibly a less sensitive signal processing device may be used. The signal processing device can thus be more reliable as well as less expensive.

It is the object of the invention to mitigate the drawbacks or to reduce at least the effect thereof on the measurement signal, without the addition of expensive elements. To this end, a nuclear magnetic resonance tomography apparatus of the kind set forth in accordance with the invention is characterized in that a Faraday cage, which increases the Q factor of a coil circuit which comprises the second coil arrangement, is arranged around the second coil arrangement but inside the first coil arrangement.

Because the Faraday cage is arranged inside the coil arrangement for the steady main magnetic field and the quasi-steady gradient field in a nuclear magnetic resonance tomography apparatus in accordance with the invention, the conductors no longer penetrate the cage so that they no longer require interference suppression; measurements have demonstrated that the Q factor of the coil circuit comprising the coil arrangement for the RF field is substantially higher than in known apparatus.

The Faraday cage in a preferred embodiment consists of a metal gauze cylinder which is arranged at least substantially against inner sides of the coil arrangement for generating the steady magnetic field and at axial ends of which there is preferably provided a closure member. It is particularly advantageous to use metal gauze and to close the cylinder at one axial end by means of a removable, connecting gauze and to provide at a second axial end a connecting cylinder which allows for a patient to be introduced into the examination space. The length of such a connecting cylinder is preferably sufficient to ensure adequate shielding also without an axial closure member for the examination space, itself. It may be advantageous to make the connecting cylinder so large in the radial direction that a patient accommodated therein can still receive last-minute care, for example, via a side portion which can be folded back. By using a metal gauze having a comparatively high optical transmission, the negative impression of a dark tunnel can be avoided, without it being necessary to install possibly disturbing light sources therein. Adequate ventilation of the examination space is thus also ensured.

In a further preferred embodiment, the choice of the materials, including the wire thickness and the mesh size of the gauze to be used, is adapted to the desired optimum suppression of the stray fields, subject to an acceptable Q factor.

In order to obtain a permanent, properly defined electrical environment for the object under examination in a preferred embodiment in accordance with the invention, comb-shaped electrical conductors are provided near the winding wires of the RF coil arrangement on the inner side of the coil so that electric fields produced between the coils of the winding, are short-circuited. The advantages described in European Patent Application No. 47065 are thus achieved together with an increased Q factor.

Figure 2:
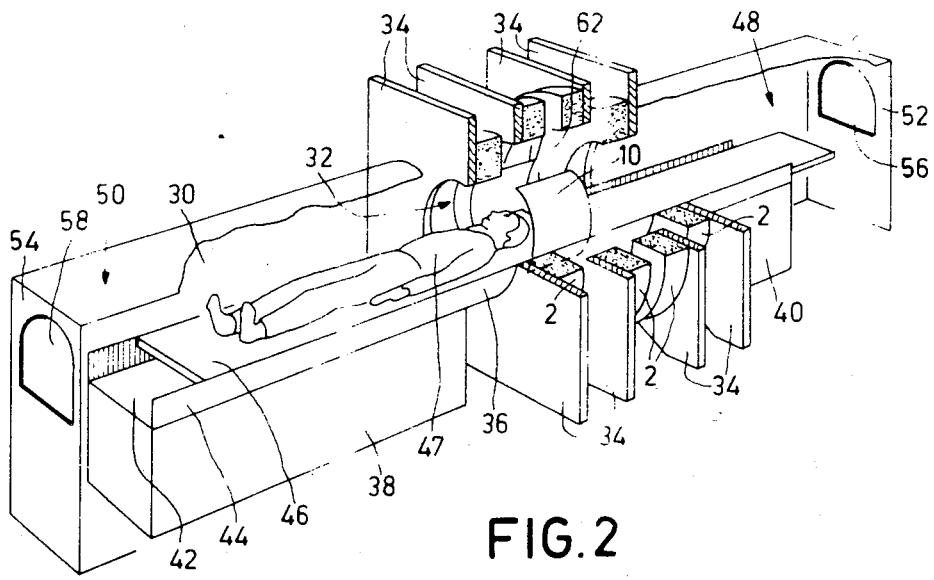
Figure 3:
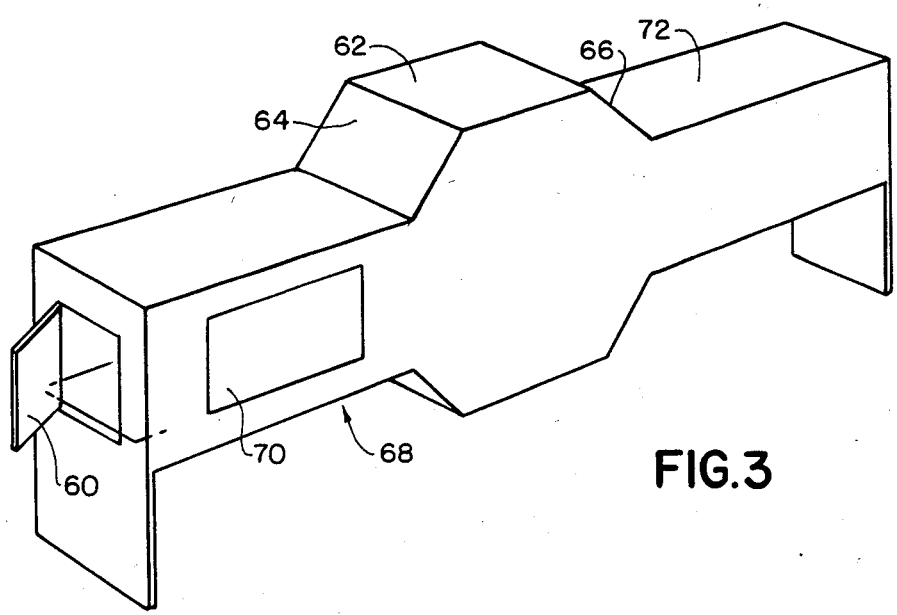
Figure 4:
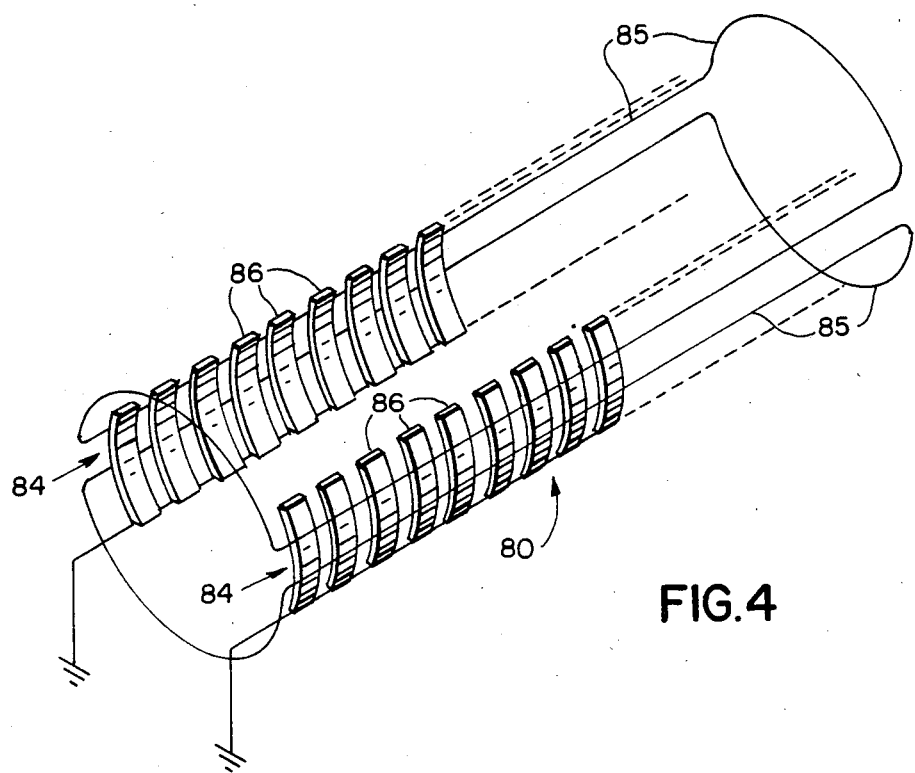

Some embodiments in accordance with the invention will be described in detail hereinafter with reference to the drawing. Therein:

FIG. 1 shows a block diagram of a known nuclear magnetic resonance tomography apparatus comprising a Faraday cage, FIG. 2 shows a nuclear magnetic resonance tomography apparatus comprising a Faraday cage in accordance with the invention, FIG. 3 shows a preferred embodiment of a Faraday cage for a nuclear magnetic resonance tomography apparatus in accordance with the invention, and FIG. 4 shows an embodiment of a transmitting-/receiving coil comprising an electrical shield.

A nuclear magnetic resonance tomography apparatus as shown in FIG. 1 comprises a first coil arrangement 1 with magnetic coils 2 for generating a stationary, homogeneous magnetic field and magnetic coils 4 for generating a quasi-stationary gradient field, a power supply source 6 with conductors 7 for the magnetic coils 4, and a power supply source 8 with conductors 9 for the magnetic coils 4. A second coil arrangement in this embodiment comprises a single magnetic coil 10 which serves to generate an RF pulsed magnetic field for which purpose it is conected to an RF supply source 12 via conductors 11, as well as to detect nuclear magnetic resonance signals which are stimulated in an object by the RF pulsed magnetic field, for which purpose the coil 10 is connected to a signal amplifier 14 via conductors 13. Via conductors 15, the signal amplifier 14 is connected to a phasesensitive rectifier 16 which is connected to a central control device 18. The central control device 18 also controls a modulator 20 for the RF supply source 12, the power supply source 8 for the quasi-steady gradient field, and a monitor 22 for image display. A high-frequency oscillator 24 controls the modulator 20 for the RF supply source 12 as well as the phase-sensitive rectifier 16 which processes the measurement signal. For cooling the magnetic coils which generate the steady field, there is provided a cooling device 27 comprising ducts 25. A cooling device of this kind may be constructed for water cooling the magnetic coils 2 (and 4) or for cooling magnet coils formed of super-conducting wire windings, by means of liquid helium in a helium Dewar vessel. Such Dewar vessel surrounds the examination space, such as 32 in FIG. 2.

A stroke-dot line in FIG. 1 denotes a Faraday-cage 26 as used in known nuclear resonance tomography-apparatus. This Faraday cage surrounds all magnetic coils and the measurement signal amplifier 14 which is constructed as a customery preamplifier. The Faraday cage is not only penetrated by the control signal input conductors 11 and the measurement signal output conductors 15, but also by the power supply conductors 7 and 9 for the coils 2 and 4 and by the cooling ducts 25. All conductors penetrating the Faraday cage should include a suitable RF interference suppression filter in order to ensure the proper operation of the apparatus. This is expensive, notably for the power supply conductors 7 and 9 which carry a large current and for the cooling ducts 25 where any leaks, lying in the frequency range of the nuclear magnetic resonance signals to be measured, will have a directly disturbing effect on the measurement signals.

FIG. 2 shows diagrammatically a nuclear magnetic resonance tomography apparatus in accordance with the invention which comprises a Faraday cage 30 which does not surround any part of the coils 2. The supply conductors 7 and 25 need no longer penetrate the Faraday cage and require no filtering, so that a substantial saving is achieved and the risk of occurrence of stray fields in the measurement space 32 is substantially reduced.

The coils 4 for generating the quasi-steady gradient field are also situated outside the Faraday cage, so that the supply conductors 9 also need not be filtered either. In an apparatus support which consists of supports 34 there is mounted a patient supporting device 36 which includes further supports 38 and 40. To either side of a cover plate 42 the support comprises upright edges 44. The cover plate 42 together with the upright edges may form part of the Faraday cage; alternatively, the metal gauze of the cage can be mounted therein or thereagainst. Inside the cage the patient table comprises a displaceable carriage 46 on which a patient 47 can be positioned in order to be introduced into the measurement space. The carriage is situated completely inside the Faraday cage at least during a measurement; and to this end the cage is provided at its axial ends 48 and 50 with end plates 52 and 54 having openings 56 and 58.

The openings 56 and 58 can be closed, for example, as shown in FIG. 3 by means of hinged wall portions 60. The transmitting/receiving coil 10 is arranged inside the cage. To achieve this, in this region the cage may comprise a widened portion 62 which follows the inner boundary of the magnetic coils in customary magnet arrangements.

The Faraday cage in accordance with the invention mainly consists of preferably copper gauze whose wire thickness and mesh size are adapted so as to provide optimum shielding; however, the fact that it must be possible to illuminate the cylinder from the outside and that suitable ventilation is required is also taken into account. It has been found in practice that copper wire having a thickness of approximately 0.2 mm with a mesh size of approximately 1.5 mm offers favourable results. Such copper gauze is commercially available and can be readily formed so as to obtain the desired shape.

FIG. 3 shows an embodiment of a Faraday cage in accordance with the invention in which the cylinder has a subtantially rectangular shape with two tapered portions 64 and 66 in the region of the measurement field, and a wider portion 62 which is situated therebetween. A first extension 68 is substantially widened in at least three directions, thus forming a chamber. Lastminute care can be given to a patient positioned therein via a hinged wall portion 70. This portion, or a second extension 72, may also comprise facilities for either accomodating a drive motor for the carriage 46 or for providing a shield in respect of such a motor arranged outside the cage.

Using a Faraday cage in accordance with the invention as described thus far, the Q factor for the transmitting/receiving coil is substantially improved. Using an optimum cage, the Q factor can be easily increased by a factor of 5 for a relevant frequency range. In practical cases the gain is provided notably at the upper end of the RF spectrum to be used. A further improvement can be achieved by introducing suitable electrical facilities in the RF coil. FIG. 4 shows a preferred embodiment thereof. In a coil 80 there are provided electrical conductors 86 which bridge spaces 84 between current-carrying parts of the conductors 85 of the coil circumferentially. In order to prevent the electrical conductors from forming conductive loops, the conductors 86 are interconnected on only one side, with the connection being grounded. The coil is thus provided with two comb-shaped elements 86 which limit the extent of electrical fields around the current-carrying wires so that, together with a higher Q factor for the coil, it is achieved that the current-carrying wires of the coil now have a fixed stray capacitance with respect to the electrical combs. The capacitance is hardly influenced by the geometry or the nature of an object to be measured when arranged inside the coil. This also eliminates the necessity of tuning the circuit for the measurement coil due to varying electrical fields in the region of the object being measured.

What is claimed is:

1. A nuclear magnetic resonance tomography apparatus comprising
   first coil means for generating a steady main magnetic field and a quasi-steady gradient field, said first coil means being arranged around an examination space for an object to be examined, second coil means including a coil circuit for generating an RF magnetic field, said second coil means being located within said first coil means, measurement means for detecting nuclear magnetic resonance signals generated by said object, and Faraday cage means for electromagnetically shielding said examination space, said Faraday cage means increasing the Q factor of said coil circuit, and said Faraday cage means being arranged between said first coil means and said second coil means, wherein said Faraday cage means consist mainly of a metal gauze cylinder arranged at least substantially against the inner side of said first coil means, wherein said Faraday cage means includes an extension at least at one axial end of said first and second coil means, wherein said extension extending beyond said first and second coil means in the axial direction has a substantially larger transverse dimension than a portion situated within said first and second coils means, wherein said Faraday cage means consists mainly of a metal gauze having an optical transmission of at least approximately 50%, wherein said Faraday cage means at least completely surrounds said examination space for a displaceable portion of an object carrier, and wherein said second coil means is provided on the inner side of the coil circuit with comb-shaped short-circuits for electrical fields generated by current-carrying wires of said second coil means.

2. A nuclear magnetic resonance tomography apparatus as claimed in claim 1, wherein said first coil means comprises windings of superconducting wires, said Faraday cage means being positioned against a boundary of a helium Dewar vessel which surrounds said examination space.

3. A nuclear magnetic resonance tomography apparatus comprising first coil means for generating a steady main magnetic field and a quasi-steady gradient field, said first coil means being arranged around an examination space for an object to be examined, second coil means including a coil circuit for generating an RF magnetic field, said second coil means being located within said first coil means, measurement means for detecting nuclear magnetic resonance signals generated by said object and Faraday cage means for electromagnetically shielding said examination space, said Faraday cage means increasing the Q factor of said coil circuit, and said Faraday cage means being arranged between said first coil means and said second coil means, wherein said second coil means is provided on the inner side of the coil circuit with comb-shaped short-circuits for electrical fields generated by current-carrying wires of said second coil means.

4. A nuclear magnetic resonance tomography apparatus comprising first coil means for generating a steady main magnetic field and a quasi-steady gradient field, said first coil means being arranged around an examination space for an object to be examined, second coil means including a coil circuit for generating an RF magnetic field, said second coil means being located within said first coil means, measurement means for detecting nuclear magnetic resonance signals generated by said object, and Faraday cage means for electromagnetically shielding said examination space, said Faraday cage means increasing the Q factor of said coil circuit, and said Faraday cage means being arranged between said first coil means and said second coil means, wherein said first coil means comprises windings of superconducting wires, said Faraday cage means being positioned against a boundary of a helium Dewar vessel which surrounds said examination space.

5. A nuclear magnetic resonance tomography apparatus according to claim 3 or claim 4, wherein said Faraday cage means consists mainly of a metal gauze cylinder arranged at least substantially against the inner side of said first coil means.

6. A nuclear magnetic resonance tomography apparatus according to claim 3 or claim 4, wherein said Faraday cage means includes an extension at least at one axial end of said first and second coil means.

7. A nuclear magnetic resonance tomography apparatus according to claim 6, wherein said extension extending beyond said first and second coil means in the axial direction has a substantially larger transverse dimension than a portion situated within said first and second coil means.

8. A nuclear magnetic resonance tomography apparatus according to claim 3 or claim 4, wherein said Faraday cage means consists mainly of a metal gauze having an optical transmission of at least approximately 50%.

9. A nuclear magnetic resonance tomography apparatus according to claim 3 or claim 4, wherein said Faraday cage means at least completely surrounds said examination space for a displaceable portion of an object carrier.

10. A nuclear magnetic resonance tomography apparatus comprising first coil means for generating a steady main magnetic field and a quasi-steady gradient field, said first coil means being arranged around an examination space for an object to be examined, second coil means including a coil circuit for generating an RF magnetic field, said second coil means being located within said first coil means, measurement means for detecting nuclear magnetic resonance signals generated by said object, and Faraday cage means for electromagnetically shielding said examination space, said Faraday cage means increasing the Q factor of said coil circuit, and said Faraday cage means being arranged between said first coil means and said second coil means.

11. A nuclear magnetic resonance tomography apparatus according to claim 10, wherein said Q factor is increased by a factor of 5.

12. A nuclear magnetic resonance tomography apparatus according to claim 10, wherein said Faraday cage means consists mainly of a metal gauze cylinder arranged at least substantially against the inner side of said first coil means.

13. A nuclear magnetic resonance tomography apparatus according to claim 10, wherein said Faraday cage means includes an extension at least at one axial end of said first and second coil means.

14. A nuclear magnetic resonance tomography apparatus according to claim 13, wherein said extension extending beyond said first and second coil means in the axial direction has a substantially larger transverse dimension than a portion situated within said first and second coil means.

15. A nuclear magnetic resonance tomography apparatus according to claim 10, wherein said Faraday cage means consists mainly of a metal gauze having an optical transmission of at least approximately 50%.

16. A nuclear magnetic resonance tomography apparatus according to claim 10, wherein said Faraday cage means at least completely surrounds said examination space for a displaceable portion of an object carrier.

* * * * *